US008291362B2

(12) United States Patent
Ushiyama

(10) Patent No.: US 8,291,362 B2
(45) Date of Patent: Oct. 16, 2012

(54) DESIGN SUPPORT PROGRAM, DESIGN SUPPORT DEVICE, AND DESIGN SUPPORT METHOD

(75) Inventor: Kenichi Ushiyama, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/826,293

(22) Filed: Jun. 29, 2010

(65) Prior Publication Data

US 2011/0035710 A1 Feb. 10, 2011

(30) Foreign Application Priority Data

Aug. 5, 2009 (JP) ................................. 2009-182363

(51) Int. Cl.
*G06F 17/50* (2006.01)

(52) U.S. Cl. ........ 716/106; 716/111; 716/129; 716/130; 703/16

(58) Field of Classification Search .................. 716/106, 716/111, 129, 130; 703/16

See application file for complete search history.

(56) References Cited

U.S. PATENT DOCUMENTS

| 7,222,322 B1* | 5/2007 | Chyan et al. ................... 716/122 |
| 8,117,583 B2* | 2/2012 | Gotou ........................... 716/130 |
| 2002/0077798 A1 | 6/2002 | Inoue et al. |
| 2003/0115566 A1* | 6/2003 | Teig ................................ 716/14 |
| 2003/0167451 A1* | 9/2003 | Igarashi ............................ 716/5 |
| 2006/0190900 A1* | 8/2006 | Chan et al. ...................... 716/13 |
| 2009/0210849 A1* | 8/2009 | Chan et al. ...................... 716/13 |
| 2010/0281448 A1* | 11/2010 | He .................................... 716/6 |

FOREIGN PATENT DOCUMENTS

| JP | 2001-265826 A | 9/2001 |
| JP | 2006-278613 A | 10/2006 |
| JP | 2008-028161 A | 2/2008 |

* cited by examiner

*Primary Examiner* — Phallaka Kik
(74) *Attorney, Agent, or Firm* — Arent Fox LLP

(57) ABSTRACT

A design support program stored in a computer readable recording medium and executed by the computer includes computer readable program code stored thereon for causing a computer to execute operations of: selecting a first hierarchy which has different first characteristic information included in wiring layer structure information in a storage device; generating second characteristic information including the first characteristic information; copying wiring layer structure information; and converting the first characteristic information included in the copied wiring layer structure information into the second characteristic information to obtain a converted wiring layer structure information.

8 Claims, 18 Drawing Sheets

| LAYER NAME | WIRING WIDTH | WIRING SPACE |
|---|---|---|
| METAL1 | Wi | Si |
| METAL2 | Wj | Sj |
| METAL3 | Wk | Sk |
| METAL4 | Wo | So |
| METAL5 | Wp | Sp |
| METAL7 | Ws | Ss |
| METAL8 | Wg | Sg |

FIG.5

| LAYER NAME | WIRING WIDTH VARIATION VALUE | | WIRING SPACE VARIATION VALUE | | RESISTANCE VALUE VARIATION VALUE | | HEIGHT VARIATION VALUE | | DIELECTRIC CONSTANT VARIATION VALUE | |
|---|---|---|---|---|---|---|---|---|---|---|
| | MINIMUM VALUE | MAXIMUM VALUE | MINIMUM VALUE | MAXIMUM VALUE | MINIMUM VALUE | MAXIMUM VALUE | MINIMUM VALUE | MAXIMUM VALUE | MINIMUM VALUE | MAXIMUM VALUE |
| METAL1 | Wimin | Wimax | Simin | Simax | Rimin | Rimax | Himin | Himax | εimin | εimax |
| METAL2 | Wjmin | Wjmax | Sjmin | Sjmax | Rjmin | Rjmax | Hjmin | Hjmax | εjmin | εjmax |
| METAL3 | Wkmin | Wkmax | Skmin | Skmax | Rkmin | Rkmax | Hkmin | Hkmax | εkmin | εkmax |
| METAL4 | Womin | Womax | Somin | Somax | Romin | Romax | Homin | Homax | εomin | εomax |
| METAL5 | Wpmin | Wpmax | Spmin | Spmax | Rpmin | Rpmax | Hpmin | Hpmax | εpmin | εpmax |
| METAL7 | Wsmin | Wsmax | Ssmin | Ssmax | Rsmin | Rsmax | Hsmin | Hsmax | εsmin | εsmax |
| METAL8 | Wgmin | Wgmax | Sgmin | Sgmax | Rgmin | Rgmax | Hgmin | Hgmax | εgmin | εgmax |

FIG.9

Table 305:

| LAYER NAME 304 | WIRING WIDTH 306 | WIRING SPACE 307 |
|---|---|---|
| METAL1 | Wi | Si |
| METAL2 | Wj | Sj |
| METAL3 | Wk | Sk |
| METAL4 | Wo | So |
| METAL5 | Wp | Sp |
| METAL7 | Ws | Ss |
| METAL8 | Wg | Sg |

(Ws<=Wg) (Ss<=Sg)

⇩ GENERATION

Table 601:

| LAYER NAME 304 | WIRING WIDTH 306 | WIRING SPACE 307 |
|---|---|---|
| METAL1 | Wi | Si |
| METAL2 | Wj | Sj |
| METAL3 | Wk | Sk |
| METAL4 | Wo | So |
| METAL5 | Wp | Sp |
| METAL7 | Ws | Ss |
| METAL8 | Wg | Sg |
| METAL78 | Wg | Sg |

FIG.10

| LAYER NAME | WIRING WIDTH VARIATION VALUE | | WIRING SPACE VARIATION VALUE | | RESISTANCE VALUE VARIATION VALUE | | HEIGHT VARIATION VALUE | | DIELECTRIC CONSTANT VARIATION VALUE | |
|---|---|---|---|---|---|---|---|---|---|---|
| | MINIMUM VALUE | MAXIMUM VALUE | MINIMUM VALUE | MAXIMUM VALUE | MINIMUM VALUE | MAXIMUM VALUE | MINIMUM VALUE | MAXIMUM VALUE | MINIMUM VALUE | MAXIMUM VALUE |
| METAL1 | Wimin | Wimax | Simin | Simax | Rimin | Rimax | Himin | Himax | εimin | εimax |
| METAL2 | Wjmin | Wjmax | Sjmin | Sjmax | Rjmin | Rjmax | Hjmin | Hjmax | εjmin | εjmax |
| METAL3 | Wkmin | Wkmax | Skmin | Skmax | Rkmin | Rkmax | Hkmin | Hkmax | εkmin | εkmax |
| METAL4 | Womin | Womax | Somin | Somax | Romin | Romax | Homin | Homax | εomin | εomax |
| METAL5 | Wpmin | Wpmax | Spmin | Spmax | Rpmin | Rpmax | Hpmin | Hpmax | εpmin | εpmax |
| METAL7 | Wsmin | Wsmax | Ssmin | Ssmax | Rsmin | Rsmax | Hsmin | Hsmax | εsmin | εsmax |
| METAL8 | Wgmin | Wgmax | Sgmin | Sgmax | Rgmin | Rgmax | Hgmin | Hgmax | εgmin | εgmax |
| | (Wsmin< =Wgmin) | (Wsmax< =Wgmax) | (Ssmin< =Sgmin) | (Ssmax< =Sgmax) | (Rgmin< =Rsmin) | (Rgmax< =Rsmax) | (Hsmin< =Hgmin) | (Hsmax< =Hgmax) | (εsmin< =εgmin) | (εsmax< =εgmax) |

⇩ GENERATION

| LAYER NAME | WIRING WIDTH VARIATION VALUE | | WIRING SPACE VARIATION VALUE | | RESISTANCE VALUE VARIATION VALUE | | HEIGHT VARIATION VALUE | | DIELECTRIC CONSTANT VARIATION VALUE | |
|---|---|---|---|---|---|---|---|---|---|---|
| | MINIMUM VALUE | MAXIMUM VALUE | MINIMUM VALUE | MAXIMUM VALUE | MINIMUM VALUE | MAXIMUM VALUE | MINIMUM VALUE | MAXIMUM VALUE | MINIMUM VALUE | MAXIMUM VALUE |
| METAL1 | Wimin | Wimax | Simin | Simax | Rimin | Rimax | Himin | Himax | εimin | εimax |
| METAL2 | Wjmin | Wjmax | Sjmin | Sjmax | Rjmin | Rjmax | Hjmin | Hjmax | εjmin | εjmax |
| METAL3 | Wkmin | Wkmax | Skmin | Skmax | Rkmin | Rkmax | Hkmin | Hkmax | εkmin | εkmax |
| METAL4 | Womin | Womax | Somin | Somax | Romin | Romax | Homin | Homax | εomin | εomax |
| METAL5 | Wpmin | Wpmax | Spmin | Spmax | Rpmin | Rpmax | Hpmin | Hpmax | εpmin | εpmax |
| METAL7 | Wsmin | Wsmax | Ssmin | Ssmax | Rsmin | Rsmax | Hsmin | Hsmax | εsmin | εsmax |
| METAL8 | Wgmin | Wgmax | Sgmin | Sgmax | Rgmin | Rgmax | Hgmin | Hgmax | εgmin | εgmax |
| METAL78 | Wsmin | Wgmax | Ssmin | Sgmax | Rgmin | Rsmax | Hsmin | Hgmax | εsmin | εgmax |

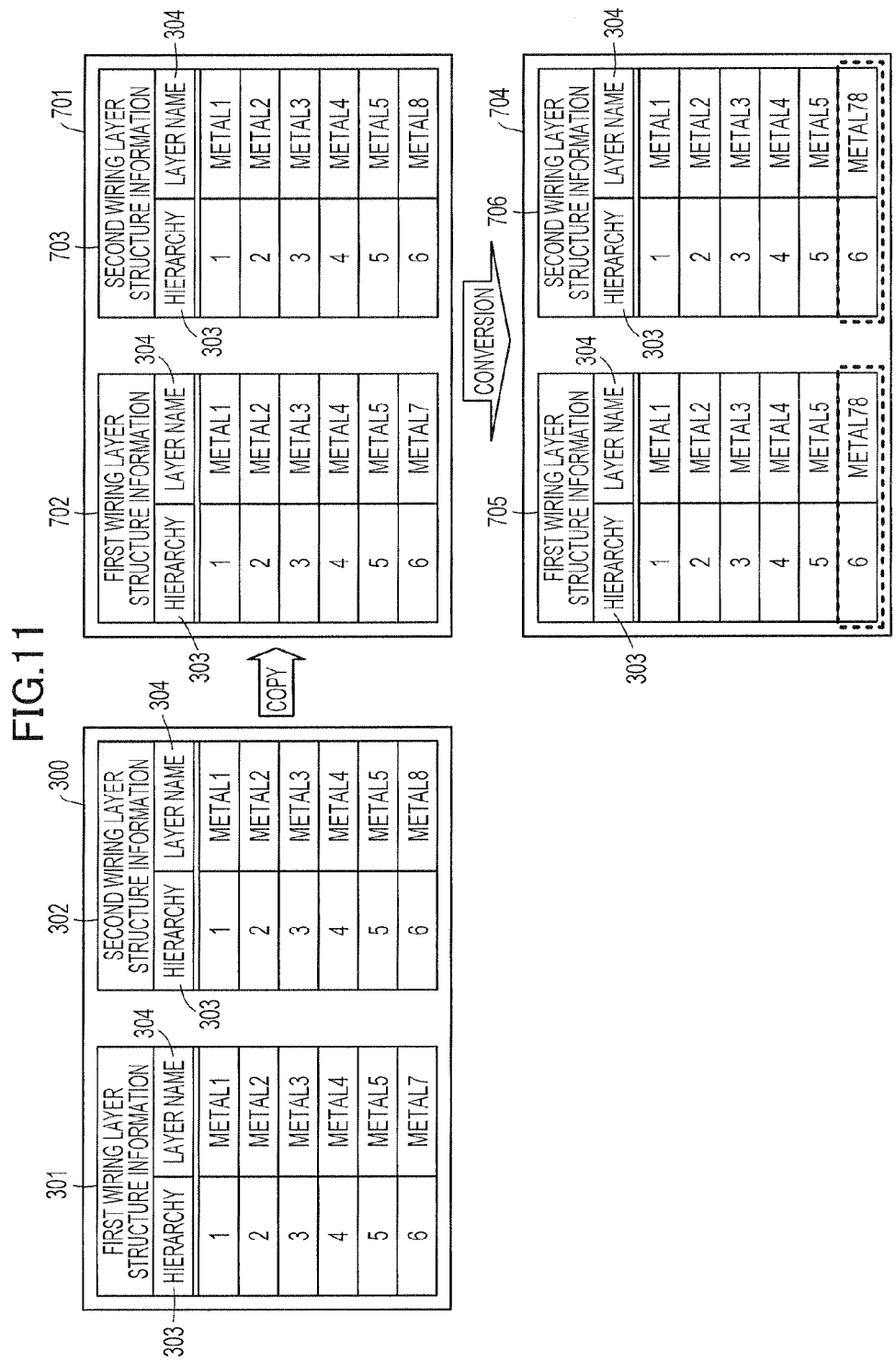

FIG.15
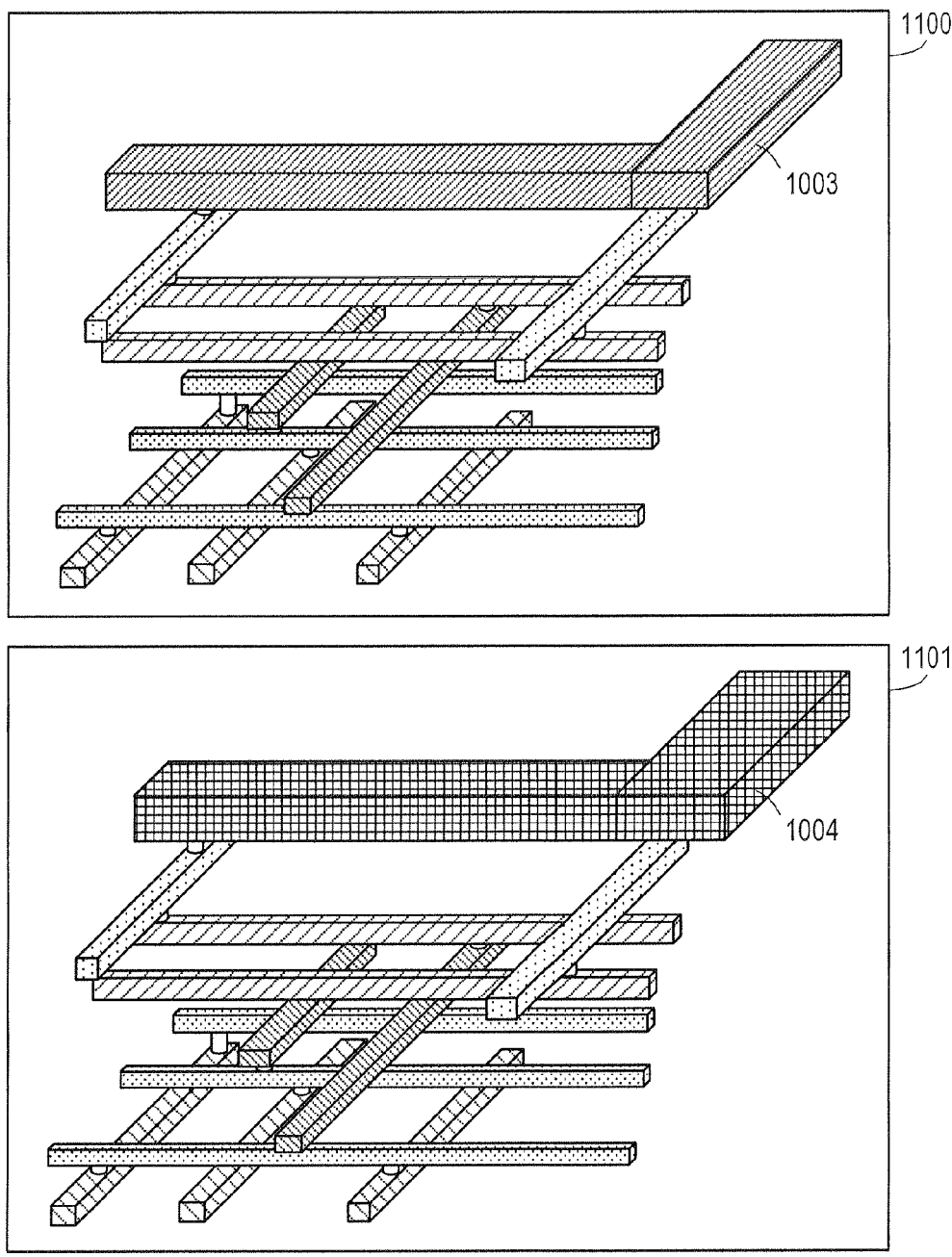
 : METAL7   : METAL8

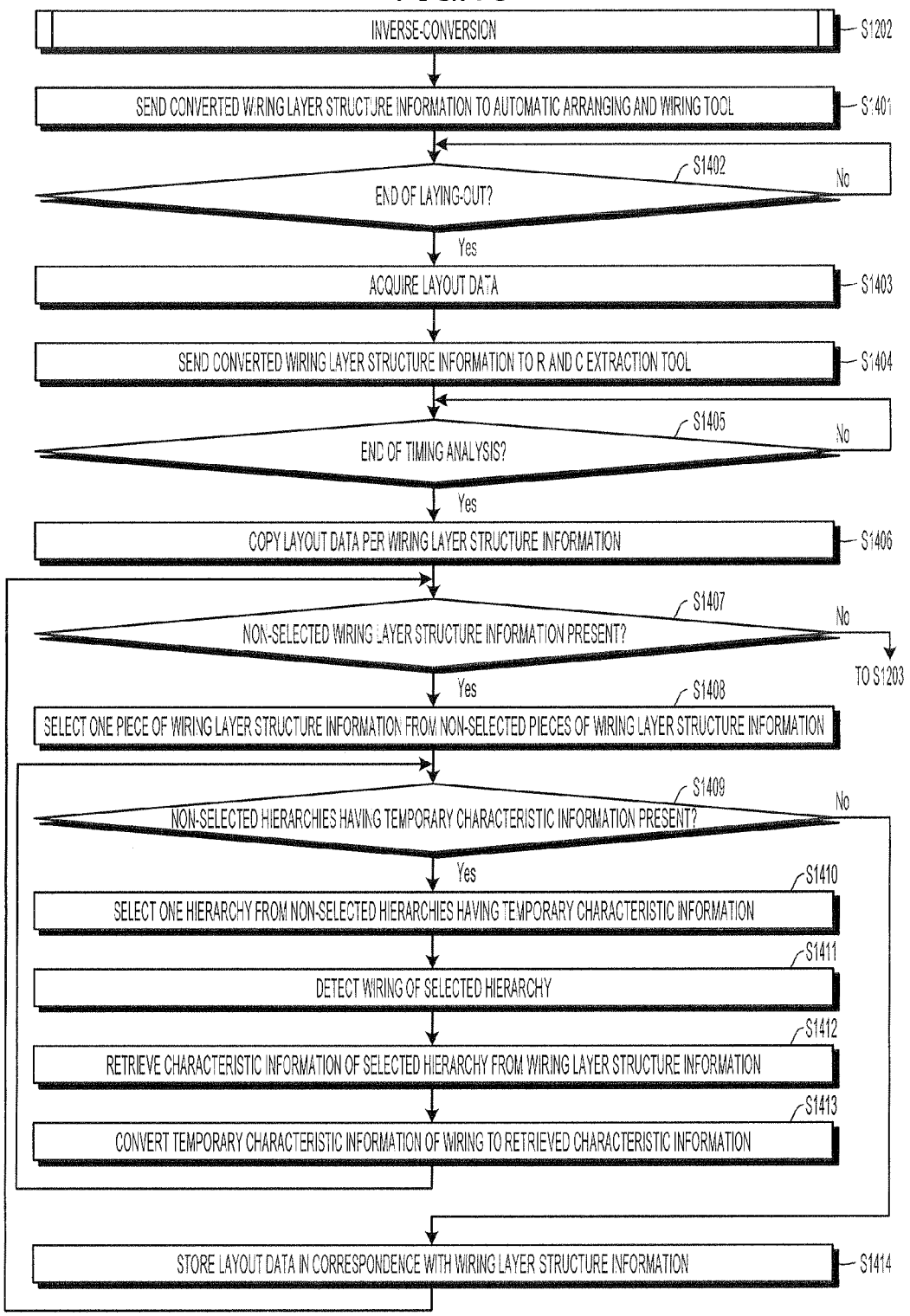

DESIGN SUPPORT PROGRAM, DESIGN SUPPORT DEVICE, AND DESIGN SUPPORT METHOD

CROSS-REFERENCE TO RELATED APPLICATIONS

This application claims the benefit of priority from Japanese Patent Application No. 2009-182363 filed on Aug. 5, 2009, the entire contents of which are incorporated herein by reference.

BACKGROUND

1. Field

The embodiments discussed herein relate to layout of a semiconductor integrated circuit.

2. Description of Related Art

In laying out a design circuit, wiring layer structure information, including wiring width and wiring space for wiring layer, are supplied to an automatic arranging and wiring tool. The automatic arranging and wiring tool outputs layout data for the design circuit.

In verifying the layout, information on the wiring resistance value (R) and the wiring capacitance value (C) for wiring and the layout data of the design circuit are supplied to an RC extraction tool and a result of the RC extraction tool and the layout data are supplied to a delay calculation tool. A result of the delay calculation tool is supplied to a timing analysis tool and the timing analysis tool analyzes the layout data in order to detect violations against constraints on timing.

Related art is disclosed, for example, in Japanese Laid-open Patent Publication No. 2008-28161, Japanese Laid-open Patent Publication No. 2001-265826 and Japanese Laid-open Patent Publication No. 2006-278613.

SUMMARY

According to one aspect of the embodiments, a design support program stored in the computer readable recording medium and executed by the computer includes computer readable program code stored thereon for causing a computer to execute operations of: selecting a first hierarchy which has different first characteristic information included in wiring layer structure information in a storage device; generating second characteristic information including the first characteristic information; copying wiring layer structure information; and converting the first characteristic information included in the copied wiring layer structure information into the second characteristic information to obtain a converted wiring layer structure information.

Additional advantages and novel features of the invention will be set forth in part in the description that follows, and in part will become more apparent to those skilled in the art upon examination of the following or upon learning by practice of the invention.

BRIEF DESCRIPTION OF THE DRAWINGS

FIG. 5 illustrates exemplary characteristic information of wiring;

FIG. 9 illustrates an exemplary generation of characteristic information;

FIG. 10 illustrates an exemplary generation of characteristic information;

FIG. 11 illustrates exemplary wiring layer structure information;

FIG. 15 illustrates an exemplary layout data

FIG. 18 illustrates an exemplary inverse conversion.

DESCRIPTION OF EMBODIMENTS

For example, when a design circuit includes wiring layer structure information having a respective characteristics, wiring layers 1 to 5 may have substantially the same characteristics and wiring layers 6 may have a different characteristics. Laying-out and verification may be executed on respective wiring layer structure information having wiring characteristics which are different from one another.

Figure 1:
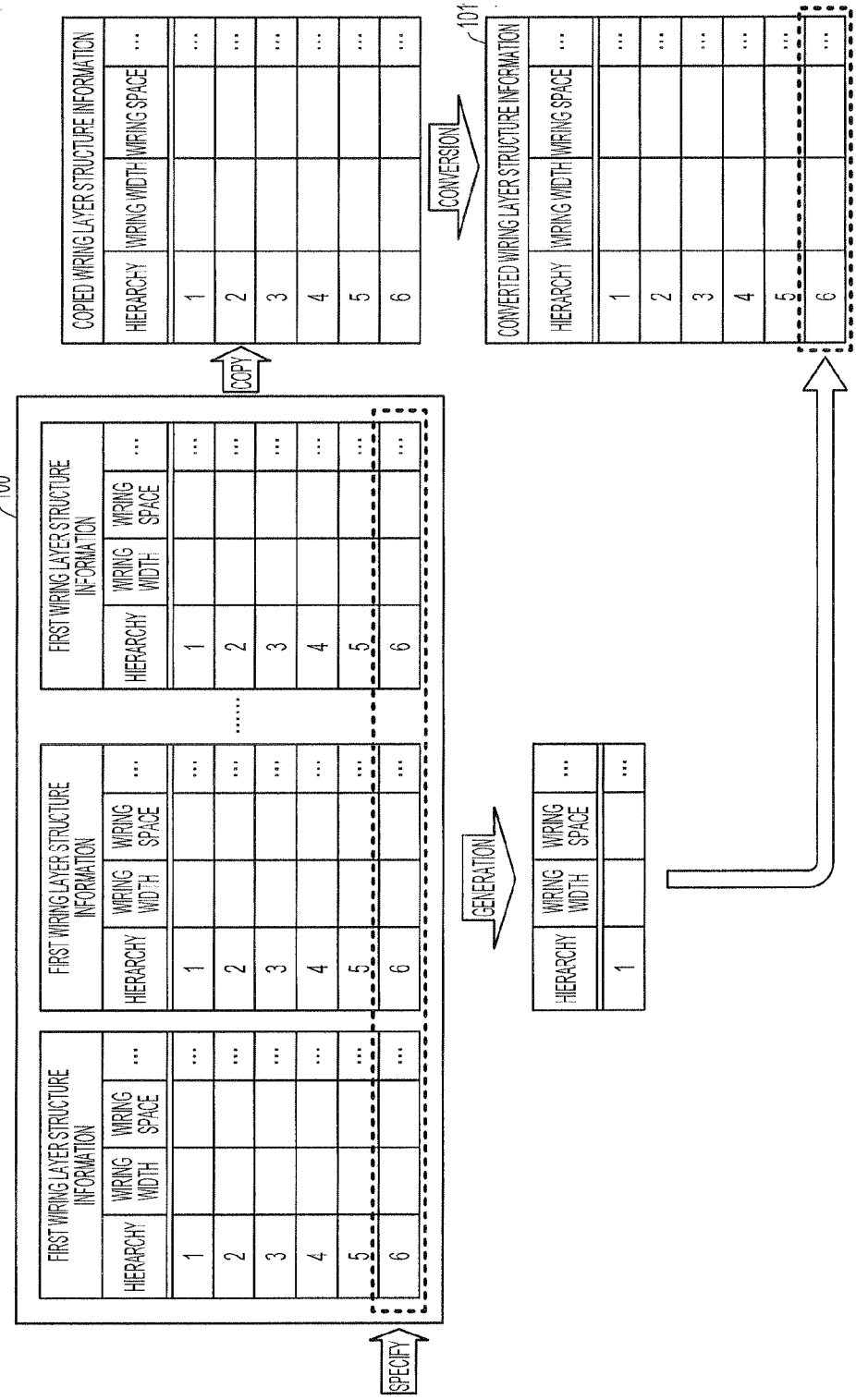
FIG. 1 illustrates an exemplary aspect in accordance with an embodiment.

FIG. 1 illustrates an aspect in accordance with embodiment. Wiring layer structure information 100 is stored in a computer accessible storage device. The wiring layer structure information 100 includes the first to the N-th wiring layer structure information (N≧2), each wiring layer having a defined wiring width and wiring space.

Figure 2:
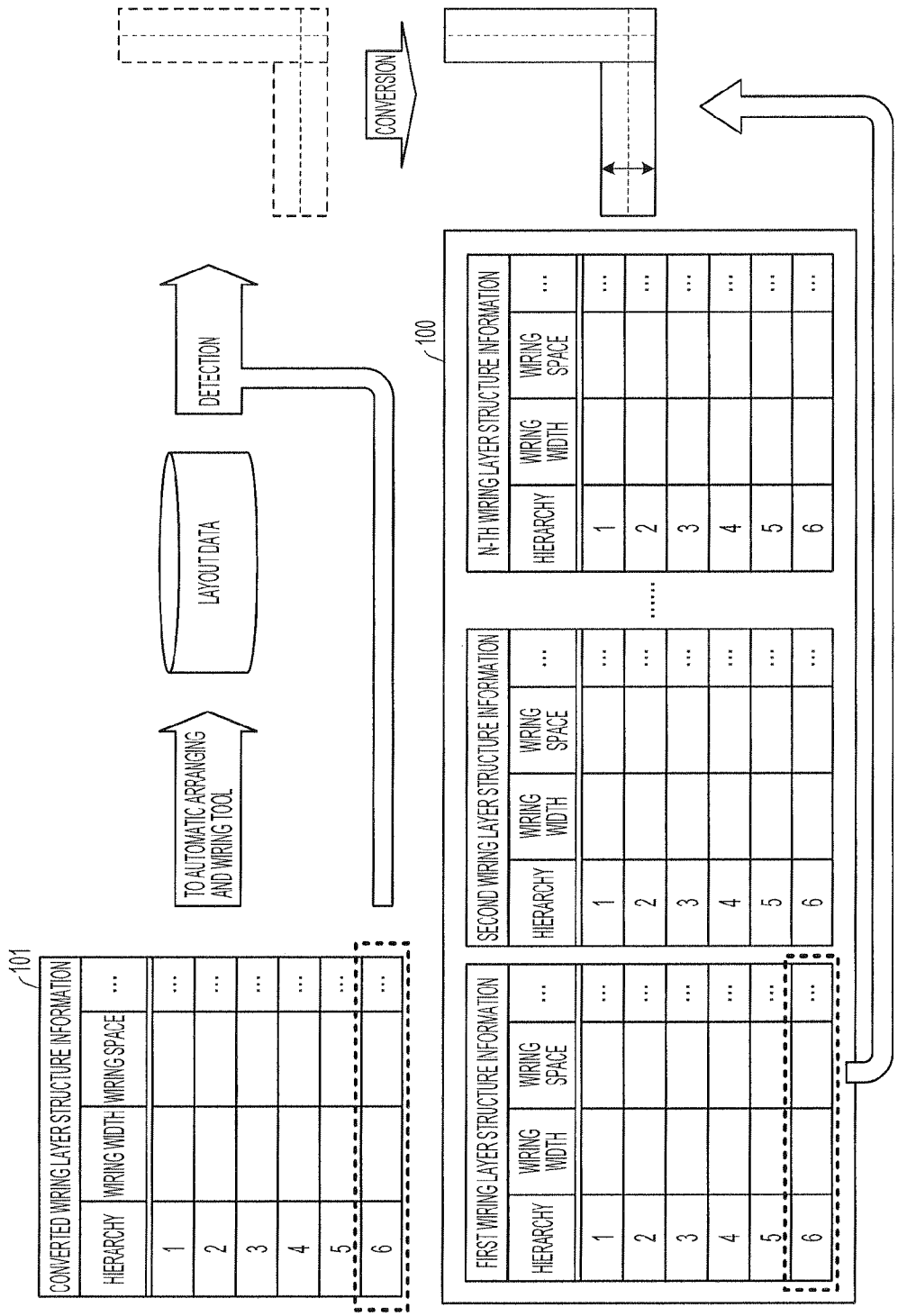
FIG. 2 illustrates an exemplary aspect of an embodiment.

A design support device specifies hierarchies that have different characteristic information from among the wiring layer structure information 100. For example, the hierarchies 6 may be specified, as illustrated in FIGS. 1 and 2. The design support device generates characteristic information including the characteristic information of the six hierarchies.

The design support device copies the wiring layer structure information and converts the characteristic information of the hierarchy, e.g. hierarchy 6, in the copied wiring layer structure information to converted characteristic information. Thus, the wiring layer structure information 100 is associated with the converted wiring layer structure information 101.

The wiring layer structure information is integrated into single wiring layer structure information. Therefore, the layout may be performed without taking a difference of the wiring layer structure information into consideration. As a result, a time period for designing may reduce.

The converted wiring layer structure information 101 may be wiring layer structure information for layout and might not be used during manufacturing.

FIG. 2 illustrates an exemplary aspect in accordance with an embodiment. The design support device supplies the converted wiring layer structure information 101 to an automatic arranging and wiring tool. The design support device acquires layout data that the automatic arranging and wiring tool laid out based on the converted wiring layer structure information 101. The design support device detects wiring from the layout data for each hierarchy.

The design support device converts characteristic information of the detected wiring to the characteristic information of an arbitrary hierarchy of the wiring layer structure information 100. The characteristic information of the wiring may be converted to the characteristic information of the hierarchy 6 of the first wiring layer structure information. As a result, the layout data is readily generated regardless of the type of the wiring layer structure information.

Figure 3:
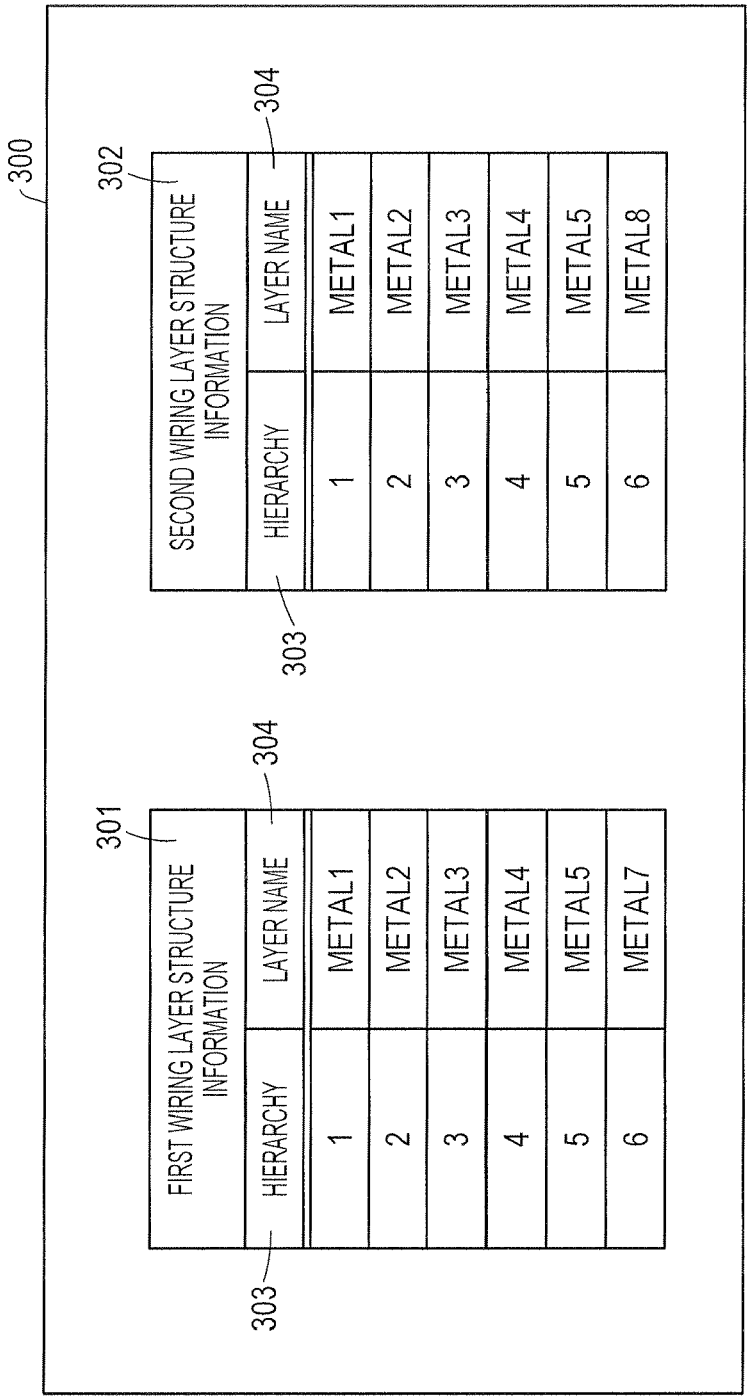
FIG. 3 illustrates exemplary wiring layer structure information.

FIG. 3 illustrates exemplary wiring layer structure information. Wiring layer structure information 300 may include first wiring layer structure information 301 and second wiring layer structure information 302. Each of wiring layer structure information may include a hierarchy (layer) 303 and a layer name 304. The lowermost layer of the hierarchy 303 may be a hierarchy 1. Characteristic information may be obtained by using the layer name 304 as a retrieval key. The wiring layer structure information 300 may be stored in a computer accessible storage device.

Figure 4:
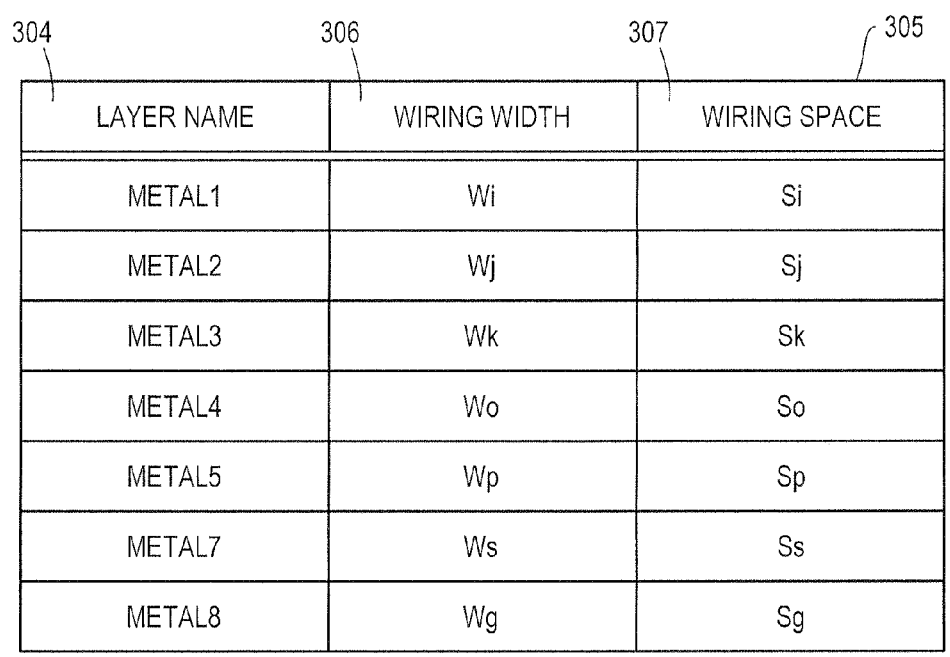
FIG. 4 illustrates exemplary characteristic information of wiring.

FIG. 4 illustrates exemplary characteristic information of wiring. The characteristic information of the wiring illustrated in FIG. 4 may be characteristic information regarding wiring constraints on design. A design rule 305 may include information regarding constraints on design. The design rule 305 includes the layer name 304, a wiring width 306 and a wiring space 307. For the layer designated by METAL1 as the layer name 304, the wiring width 306 may be Wi and the wiring space 307 may be Si.

The design object circuit may be designed without violating the constraints on design regardless of integration of the wiring layer structure information to the single wiring layer structure information. Information regarding the constraints on design may include information other than that regarding the wiring width and the wiring space.

The design rule 305 may be stored into a computer accessible storage device.

FIG. 5 illustrates exemplary characteristic information of wiring. The characteristic information of wiring illustrated in FIG. 5 may include characteristic information of wiring for R and C extraction. An R and C extraction rule 308 may include characteristic information of wiring for the R and C extraction. The R and C extraction rule 308 includes the layer name 304, a variation value 309 of the wiring width, a variation value 310 of the wiring space, a variation value 311 of the resistance value, a variation value 312 of the height and a variation value 313 of the dielectric constant.

When the layer name 304 is METAL1, the variation value 309 of the wiring width ranges from a minimum value Wimin to a maximum value Wimax with the wiring width 306 being ° designated by Wi in the design rule 305 illustrated in FIG. 4. Likewise, when the wiring space 307 is designated by Si in the design rule 305 illustrated in FIG. 4, the variation value 310 of the wiring space ranges from a minimum value Simin to a maximum value Simax.

When the standard resistance value is designated by Ri, the variation value 311 of the resistance value ranges from a minimum value Rimi to a maximum value Rimax. When the standard height value is designated by Hi, the variation value 312 of the height ranges from a minimum value Himin to a maximum value Himax. When the standard dielectric constant value is designated by ∈i, the variation value 313 of the dielectric constant ranges from a minimum value ∈imin to a maximum value ∈imax. Even if the wiring layer structure information is converted to the single wiring layer structure information, the variation values are included so that the R and C extraction may be accurately executed and the design object circuit may be designed without offending against the constraints on timing.

The characteristic information of wiring of the R and C extraction may include information other than information on the variation value of the wiring width, the variation value of the wiring space, the variation value of the resistance value, the variation value of the height or the variation value of the dielectric constant. The wiring layer structure information may include characteristic information such as the size, the resistance value and the capacitance value of a via.

The R and C extraction rule 308 may be stored into a computer accessible storage device.

Figure 6:
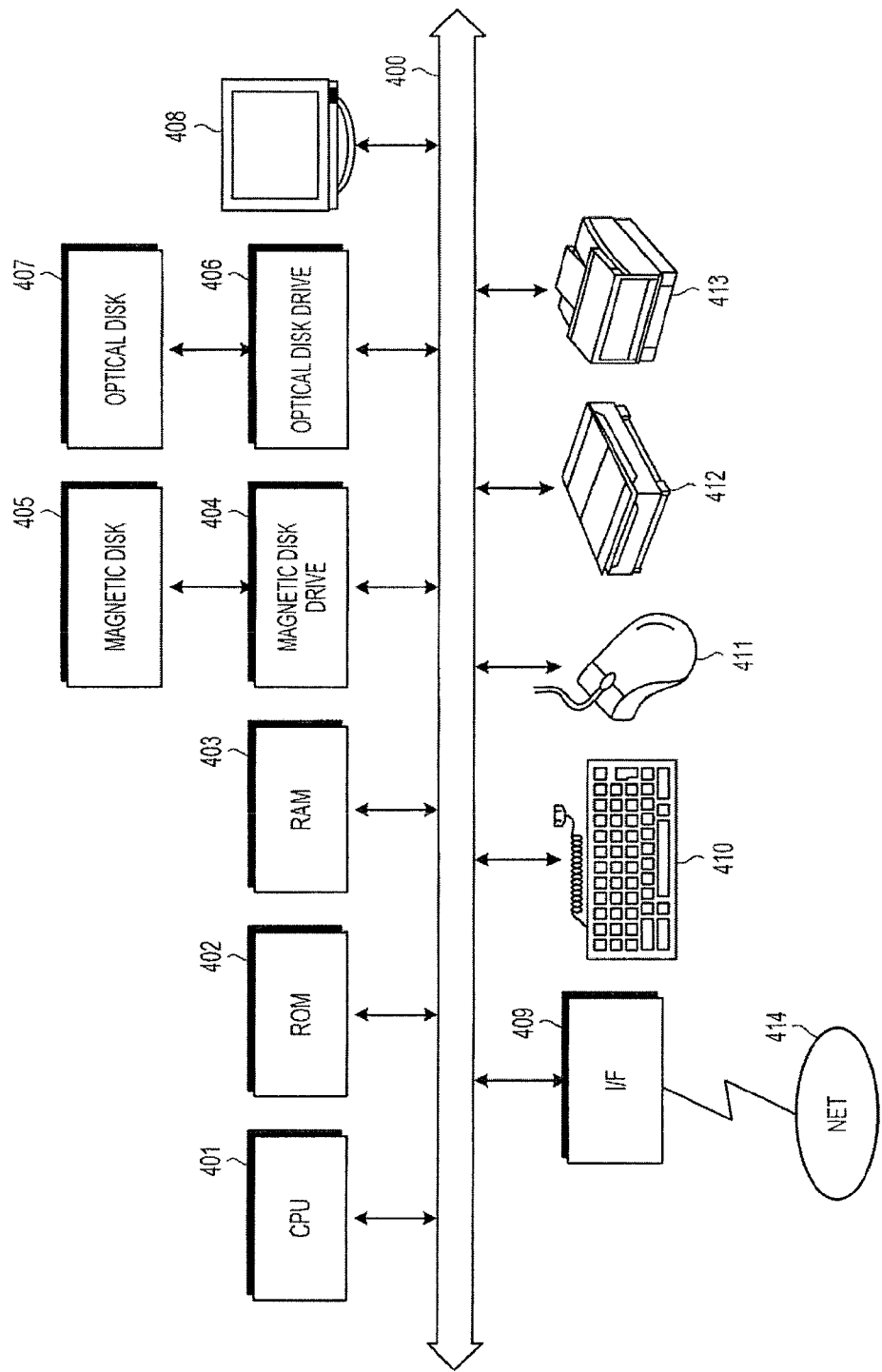
FIG. 6 illustrates an exemplary design support device.

FIG. 6 illustrates an exemplary design support device. The design support device may include a Central Processing Unit (CPU) 401, a Read-Only Memory (ROM) 402, a Random Access Memory (RAM) 403, a magnetic disk drive 404, a magnetic disk 405, an optical disk drive 406, an optical disk 407, a display 408, an Interface (I/F) 409, a keyboard 410, a mouse 411, a scanner 412 and a printer 413. The abovementioned elements may be coupled with one another via a bus 400.

The CPU 401 may control the entire operation of the design support device. The ROM 402 may store a program such as a design support program. The RAM 403 may be used as a work area of the CPU 401. The magnetic disk drive 404 controls operations of reading data from the magnetic disk 405 and writing data into the magnetic disk 405. The magnetic disk 405 stores data.

The optical disk drive 406 controls operations of reading data out of the optical disk 407 and writing data into the optical disk 407. Data is stored into the optical disk 407 and the data is read from the optical disk 407.

The display 408 displays a cursor, icons, tool boxes and data such as documents, images and functional information. The display 408 may include, for example, a CRT, a TFT liquid crystal display, a plasma display and others.

The I/F 409 may be coupled to a network 414 such as Local Area Network (LAN), Wide Area Network (WAN) and Internet via a communications line and may be coupled to another device via the network 414. The I/F 409 interfaces the network 414 with an internal unit of the device to control an input of data from an external devoice and an output of data to the external device. The I/F 409 may include, for example, a modem, an LAN adopter and others.

The keyboard 410 includes keys for inputting input characters, numerals and various instructions. The keyboard 410 may include a touch panel type input pad, a ten-key and others. The mouse 411 is used to move the cursor or a window, to select a range or to change the size of the window. The mouse 411 may include a pointing device, a track ball and/or a joystick.

The scanner 412 optically reads an image and fetches image data into the design support device. The scanner 412 may have an Optical Character Reader (OCR) function. The printer 413 prints image data and document data. The printer 413 may include, for example, a laser printer and an ink jet printer.

Figure 7:
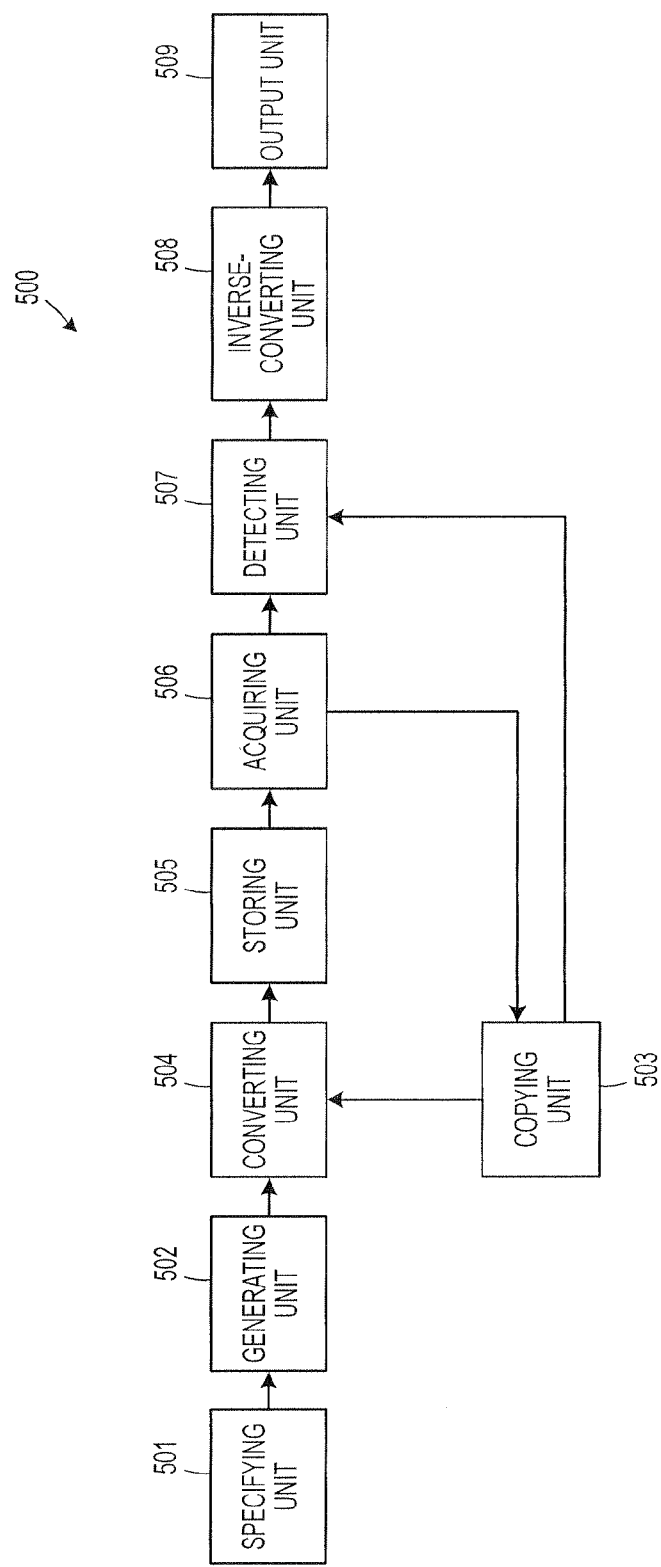
FIG. 7 illustrates an exemplary design support device.

FIG. 7 illustrates an exemplary design support device. A design support device 500 includes a specifying unit 501, a generating unit 502, a copying unit 503, a converting unit 504, a storing unit 505, an acquiring unit 506, a detecting unit 507, an inverse-converting unit 508 and an output unit 509. For example, the specifying unit 501 to the output unit 509 may make the CPU 401 execute a program stored in a storage device such as the ROM 402, the RAM 403, the magnetic disk 405 or the optical disk 407.

The specifying unit 501 specifies a hierarchy which is different from other hierarchies in terms of characteristic information from within the wiring layer structure information. For example, the CPU 401 judges whether a layer name of the corresponding hierarchy 303 of the first wiring layer structure information 301 is different from a layer name of the corresponding hierarchy 303 of the second wiring layer structure information 302 illustrated in FIG. 3. When the hierarchy 303 is 6, the layer name 304 of the first wiring layer structure information is designated by METAL7 and the layer name 304 of the second wiring layer structure information is designated by METAL8. The CPU 401 may specify the hierarchies 6 as the hierarchies which are different from each other in terms of characteristic information.

A result of this specification may be stored into a storage device or storage devices such as the RAM 403, the magnetic disk 405 and/or the optical disk 407.

The generating unit 502 generates characteristic information including the characteristic information of the hierarchies which are specified by the specifying unit 501 in units of hierarchies having different characteristic information. For example, the CPU 401 operates to acquire the characteristic information of the hierarchies having different characteristic information from the first wiring layer structure information 301 and the second wiring layer structure information 302 and generates characteristic information including characteristic information included in the information 301 and 302.

Figure 8:
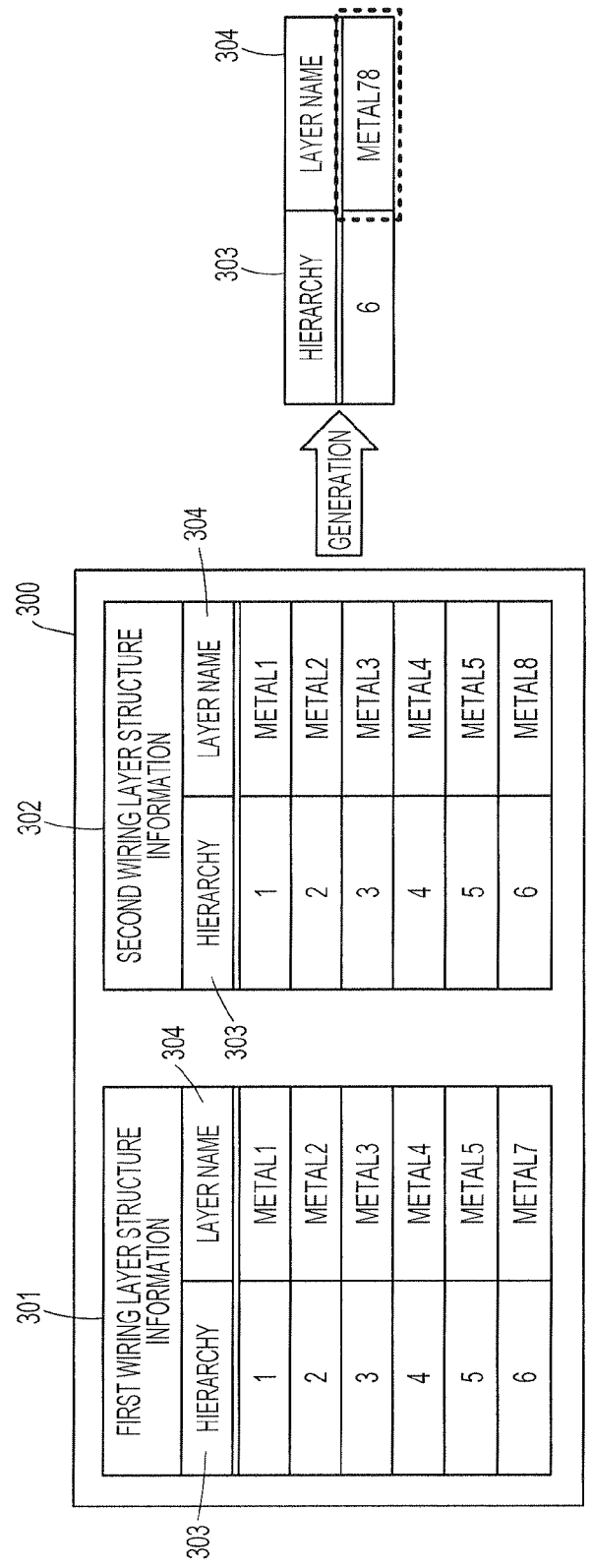
FIG. 8 illustrates an exemplary generation of characteristic information.

FIG. 8 illustrates an exemplary generation of characteristic information. The characteristic information, which includes the characteristic information obtained when the hierarchy 303 in the first wiring layer structure information 301 corresponds to the hierarchy 6 and the characteristic information obtained when the hierarchy 303 in the second wiring layer structure information 302 corresponds to the hierarchy, is generated. When the hierarchy 303 in the first wiring layer structure information 301 corresponds to the hierarchy 6, the corresponding layer name 304 is designated by METAL7. When the hierarchy 303 in the second wiring layer structure information 302 corresponds to the hierarchy 6, the corresponding layer name 304 is designated by METAL8. METAL78 may correspond to the layer name 304 of the characteristic information including the characteristic information of the layer names METAL7 and METAL8.

FIG. 9 illustrates an exemplary generation of characteristic information. The generating unit 502 generates the wiring width 306 of the layer METAL78 including the wiring widths 306 of the layers METAL7 and METAL8 based on the wiring widths 306 of the layers METAL7 and METAL8. The wiring width 306 of the layer METAL7 may be Ws and the wiring width 306 of the layer METAL8 may be Wg. Since the width Ws is narrower than the width Wg, the width Wg may be generated as the wiring width 306 of the layer METAL78.

The generating unit 502 generates the wiring space 307 of the layer METAL78 including the wiring spaces 307 of the layers METAL7 and METAL8 based on the wiring spaces 307 of the layers METAL7 and METAL8. The wiring space 307 of the layer METAL7 may be Ss and the wiring space 307 of the layer METAL may be Sg. Since the space Ss is narrower than the space Sg, the space Sg may be generated as the wiring space 307 of the layer METAL78.

FIG. 10 illustrates an exemplary generation of characteristic information of wiring. In an R and C extraction rule 602, each variation value of the layer METAL78 may be generated based on the respective variation values of the layers METAL7 and METAL8 in the R and C extraction rule 308.

A minimum value of the variation value 309 of the wiring width of the layer METAL7 may be Wsmin and a maximum value thereof may be Wsmax. A minimum value of the variation value 309 of the wiring width of the layer METAL8 may be Wgmin and a maximum value thereof may be Wgmax.

The generating unit 502 compares the minimum value of the variation value 309 of the wiring width of the layer METAL7 with the minimum value of the variation value 309 of the wiring width of the layer METAL8 and generates one minimum value which is smaller than another minimum value as the minimum value of the variation value 309 of the wiring width of the layer METAL78. Since the value Wsmin is smaller than the value Wgmin, the value Wsmin is generated as the minimum value of the variation value 309 of the wiring width of the layer METAL78.

The generating unit 502 compares the maximum value of the variation value 309 of the wiring width of the layer METAL7 with the maximum value of the variation value 309 of the wiring width of the layer METAL8 and generates one maximum value which is larger than another maximum value as the maximum value of the variation value 309 of the wiring width of the layer METAL78. Since the value Wsmax is smaller than the value Wgmax, the value Wgmax is generated as the maximum value of the variation value 309 of the wiring width of the layer METAL78. The variation value 310 of the wiring space, the variation value 311 of the resistance value, the variation value 312 of the height and the variation value 313 of the dielectric constant of the layer METAL78 may be generated in substantially the same manner as or similar manner to that of the generation of the variation value 309 of the wiring width.

The copying unit 503 illustrated in FIG. 7 copies the wiring layer structure information. The converting unit 504 converts the characteristic information of the hierarchies which have different characteristic information within the copied wiring layer structure information to the characteristic information generated by the generating unit 502 in units of hierarchies which have different characteristic information each other.

FIG. 11 illustrates exemplary wiring layer structure information. The wiring layer structure information illustrated in FIG. 11 may be the wiring layer structure information converted by the converting unit 504. The copying unit 503 copies the wiring layer structure information 300 to generate wiring layer structure information 701. The converting unit 504 converts the layer name 304 of the hierarchy 303 designated by 6 of first wiring layer structure information 702 in the wiring layer structure information 701 from METAL7 to METAL78. The converting unit 504 converts the layer name 304 of the hierarchy 303 designated by 6 of second wiring layer structure information 703 in the wiring layer structure information 701 from METAL8 to METAL78.

Wiring layer structure information 704 include first wiring layer structure information 705 and second wiring layer structure information 706 obtained after conversion of the converting unit 504. The first wiring layer structure information 705 may be substantially the same as or similar to the second wiring layer structure information 706.

The storing unit 505 illustrated in FIG. 7 stores the respective wiring layer structure information obtained after conversion of the converting unit 504 in units of wiring layer structure information in a storage device. For example, the CPU 401 may associate the first wiring layer structure information 301 in the wiring layer structure information 300 with the first wiring layer structure information 705 in the wiring layer structure information 704. For example, an address at which the first wiring layer structure information 301 is stored in the storage device may be assigned to the first wiring layer structure information 705.

The CPU 401 may associate the second wiring layer structure information 302 in the wiring layer structure information 300 with the second wiring layer structure information 706 in the wiring layer structure information 704. The wiring layer structure information 300 and the wiring layer structure information 704 may be stored in a storage device such as the RAM 403, the magnetic disk 405, the optical disk 407 or the like.

The wiring layer structure information is integrated into the single wiring layer structure information and the design object circuit is laid out based on the integrated single wiring layer structure information regardless of a difference in characteristic information within the wiring layer structure information. As a result, the design term may be reduced.

The acquiring unit 506 illustrated in FIG. 7 acquires the circuit information for the design object circuit laid out based on the converted wiring layer structure information stored in the storage device.

The acquiring unit 506 acquires the circuit information for the design object circuit which is judged not to be against the constraints on timing by extracting the resistance value and the capacitance value of the wiring based on the converted wiring layer structure information.

The CPU 401 reads the wiring layer structure information 704 form the storage device. The CPU 401 reads the wiring width 306 and the wiring space 307 per the layer name 304 from the design rule 601 based on the layer names 304 in the wiring layer structure information 704. The wiring width 306 and the wiring space 307 are supplied to the automatic arranging and wiring tool.

The CPU 401 acquires the layout data of the design object circuit laid out by the automatic arranging and wiring tool. The layout data may be stored into a storage device such as the RAM 403, the magnetic disk 405, the optical disk 407 or the like.

For example, the CPU 401 reads the variation value 309 of the wiring width, the variation value 310 of the wiring space, the variation value 311 of the resistance value, the variation value 312 of the height and the variation value 313 of the dielectric constant from the R and C extraction tool 602 based on the layer names 304 in the wiring layer structure information 704. The read information and the layout data are supplied to the R and C extraction tool. The CPU 401 may access the R and C extraction tool, the delay calculation tool or the timing analysis tool.

For example, the CPU 401 accesses the R and C extraction tool to acquire a result of R and C extraction. The result of R and C extraction and the layout data are supplied to the delay calculation tool for calculating a delay. A result of calculation is supplied from the delay calculation tool to the CPU 401. The result of delay calculation and the layout data are supplied to the timing analysis tool and a result of timing analysis is supplied from the timing analysis tool to the CPU 401. The arranging and wiring process of the automatic arranging and wiring tool, the R and C extraction process of the R and C extraction tool and the delay calculation process of the delay calculation tool are repeated until it is judged that the layout data observes the constraints on timing by the timing analysis process.

For example, when the layout data observes the constraints on timing, the layout data of the design circuit may be stored in a storage device such as the RAM 403, the magnetic disk 405, the optical disk 407 or the like.

The copying unit 503 illustrated in FIG. 7 copies the circuit information acquired by the acquiring unit 506 in associated with wiring layer structure information in units of wiring layer structure information. For example, the CPU 401 copies the layout data in units of the wiring layer structure information in the wiring layer structure information 300.

Figure 12:
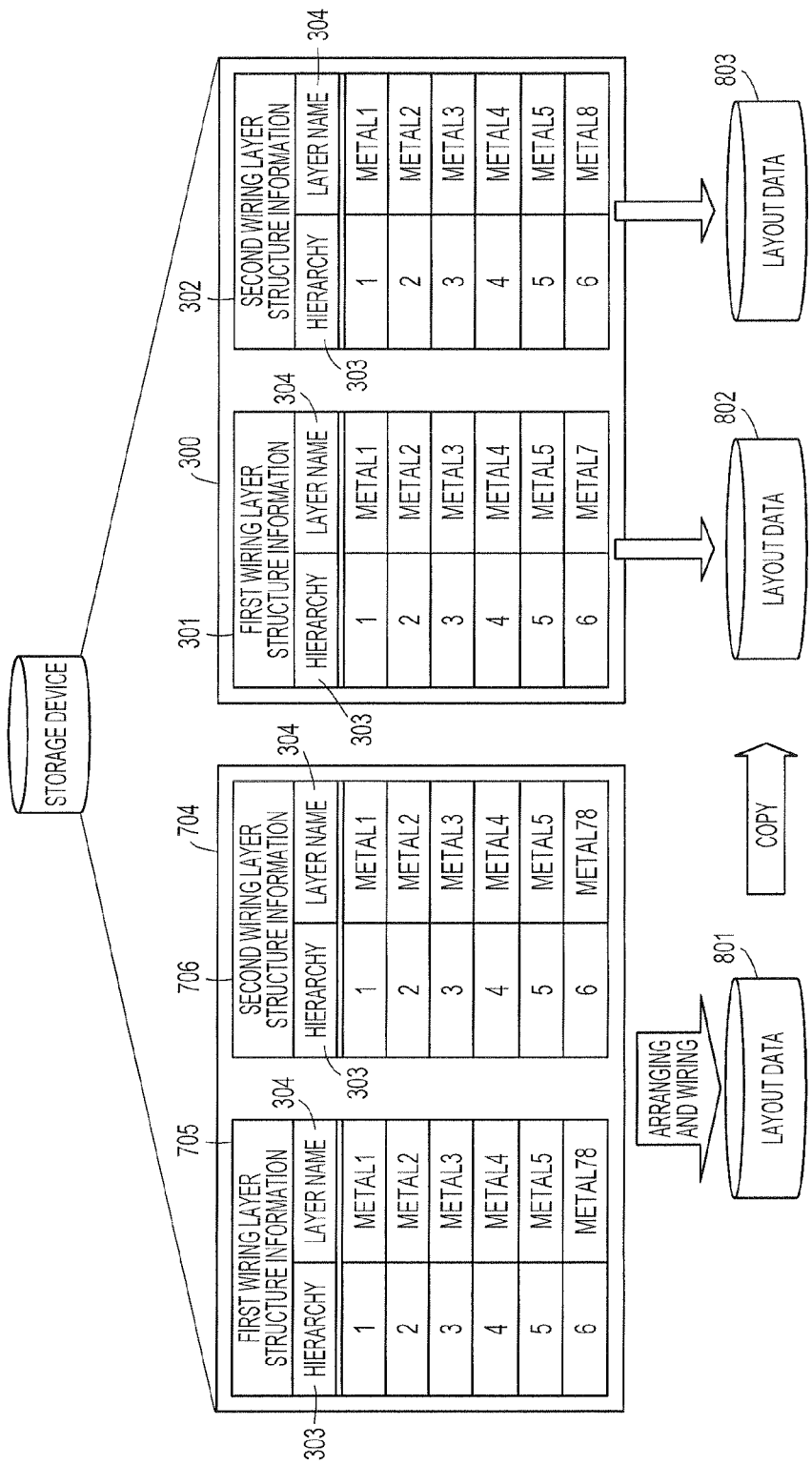
FIG. 12 illustrates an exemplary copying of layout data.

FIG. 12 illustrates an exemplary copying of a layout data. Layout data 801 may be the layout data for the design circuit based on the wiring layer structure information 704. The copying unit 503 illustrated in FIG. 7 copies the layout data 801 for each of the wiring layer structure information 300. The layout data 801 is copied, layout data 802 is associated with the first wiring layer structure information 301 and layout data 803 is associated with the second wiring layer structure information 302.

Figure 13:
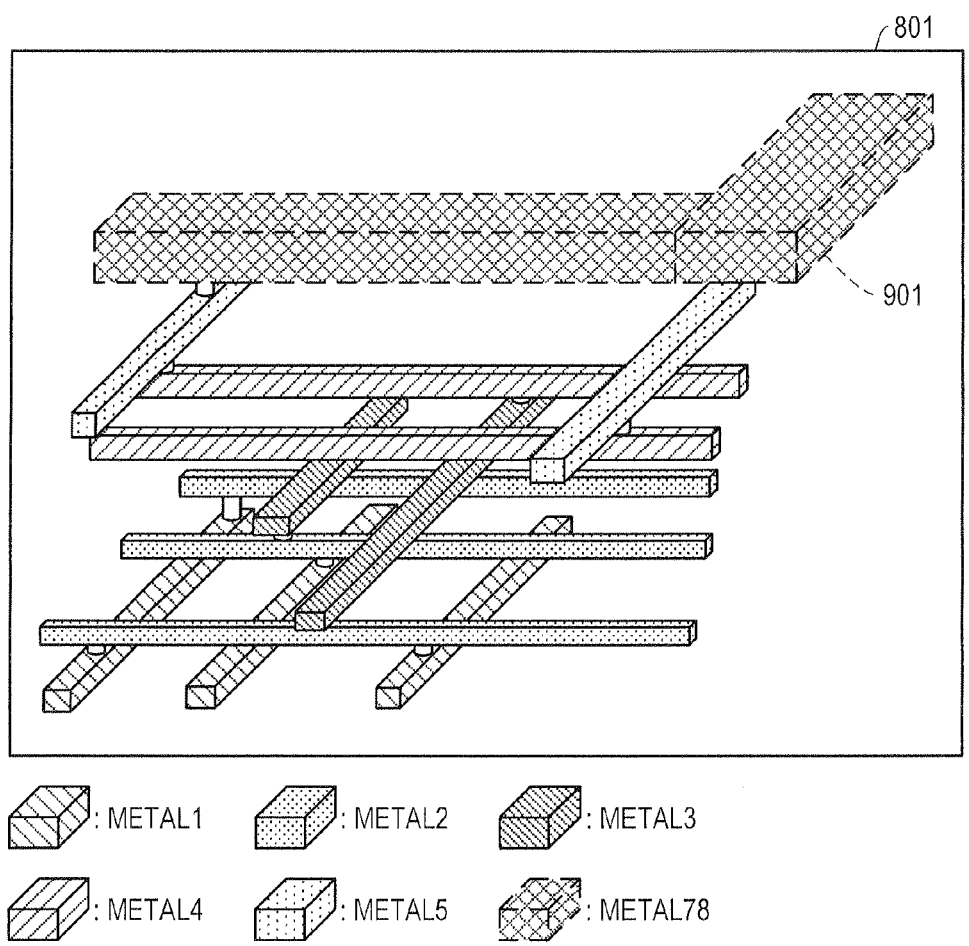
FIG. 13 illustrates an exemplary layout data.

FIG. 13 illustrates an exemplary layout data. The layout data 801 includes the layers METAL1 to METAL8 and METAL78. Wiring 901 is wired on the hierarchy 6 based on the wiring width 306 and the wiring space 307 of the layer METAL78. The layout data 802 and the layout data 803 may be substantially the same as or similar to the layout data 801.

The detecting unit 507 illustrated in FIG. 7 detects respective lengths of wiring on the hierarchies from a plurality of lengths of wiring stored in the circuit information obtained by the acquiring unit 506 in units of hierarchies. For example, the CPU 401 may detect respective lengths of wiring on the hierarchies 6 from the layout data 801.

The detecting unit 507 extracts respective lengths of wiring, which have different characteristic information, in units of hierarchies from each set of circuit information copied by the copying unit 503. For example, the CPU 401 may extract the wiring on the hierarchy 6 from the layout data 802.

The inverse-converting unit 508 illustrated in FIG. 7 converts the characteristic information of the respective lengths of wiring detected by the detecting unit 507 to the characteristic information of the hierarchy of the selected wiring layer structure information in units of hierarchies.

The inverse-converting unit 508 converts the characteristic information of the wiring detected by the detecting unit 507 to the characteristic information of the hierarchy of the selected wiring layer structure information per circuit information.

Figure 14:
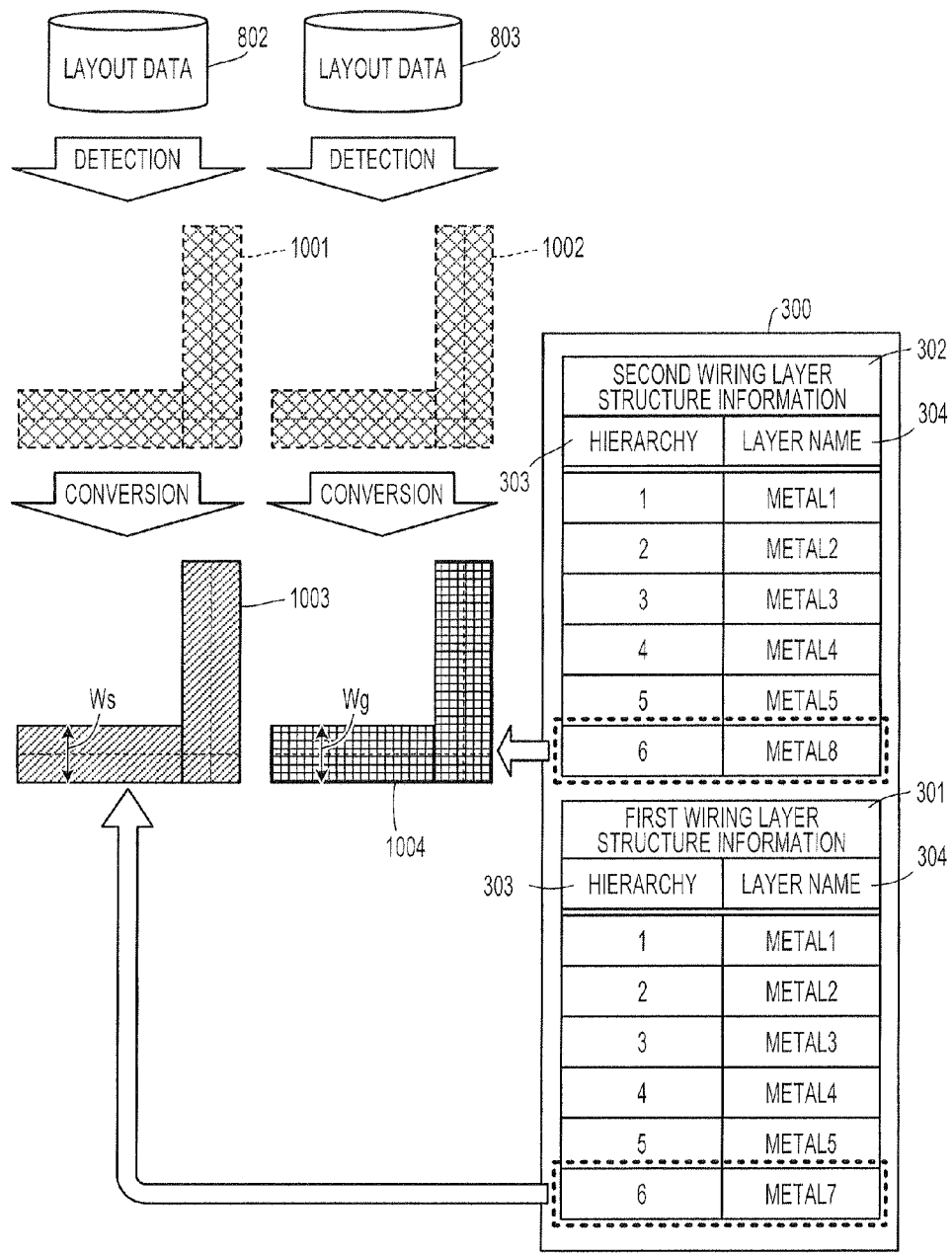
FIG. 14 illustrates an exemplary conversion of characteristic information of wiring.

FIG. 14 illustrates an exemplary conversion of the characteristic information of wiring. Wiring 1001 may be the wiring on the hierarchy 6 detected from the layout data 802. Wiring 1002 may be the wiring on the hierarchy 6 detected from the layout data 803. The wiring 901 may be substantially the same as or similar to the wiring 1001 and the wiring 1002.

For example, the CPU 401 reads the layer name 304 of the hierarchy 6 from the first wiring layer structure information 301. The corresponding wiring width 306 is read from the design rule 601 based on the layer METAL7. For example, the wiring width Ws may be read. For example, the CPU 401 may convert the wiring width of the wiring 1001 to Ws. The characteristic information of the wiring 1001 may be converted to generate wiring 1003.

For example, the CPU 401 reads the layer name 304 of the hierarchy 6 from the second wiring layer structure information 302. The corresponding wiring width 306 is read from the design rule 601 based on the layer METAL8. The wiring width Wg may be read. For example, the CPU 401 may convert the wiring width of the wiring 1002 to Wg. The characteristic information of the wiring 1002 may be converted to generate wiring 1004.

In addition, characteristic information of wiring such as the height of the wiring may be converted in the same manner or a similar manner.

FIG. 15 illustrates an exemplary layout data. The layout data illustrated in FIG. 15 may be layout data obtained after inverse-conversion. The layout data 802 may be inverse-converted based on the first wiring layer structure information 301 to generate layout data 1100. The wiring width of wiring 1003 in the layout data 110 may be Ws. The layout data 803 may be converted based on the second wiring layer structure information 302 to generate layout data 1101. The wiring width of wiring 1004 in the layout data 1101 may be Wg.

The output unit 509 illustrated in FIG. 7 outputs the circuit information which has been inverse-converted by the inverse-converting unit 508. For example, the layout data 1100 and the layout data 1101 may be output.

The layout data 1100 and 1101 may be, for example, displayed on the display 408, printed by the printer 413 or transmitted to an external device via the I/F 409. The layout data 1100 and 1101 may be stored into a storage device such as the RAM 403, the magnetic disk 405, the optical disk 407 or the like.

Layout data is generated based on the wiring layer structure information concerned regardless of the type of the wiring layer structure information. Therefore, the design term may be reduced. If the layout is generated once, layout data, which has different wiring layer structure information from that of the generated layout data, may be generated.

Figure 16:
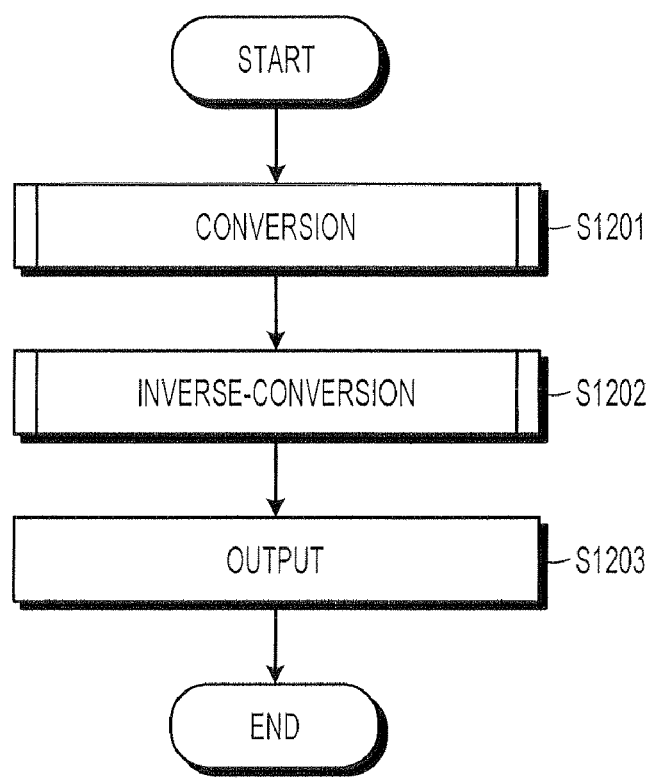
FIG. 16 illustrates an exemplary design support process.

FIG. 16 illustrates an exemplary design support process. The design support process illustrated in FIG. 16 may be executed by the design support device 500. A conversion process is executed by the specifying unit 501, the generating unit 502, the copying unit 503, the converting unit 504 and the storing unit 505 in operation S1201. An inverse-conversion process is executed by the acquiring unit 506, the copying unit 503, the detecting unit 507 and the inverse-converting unit 508 in operation S1202. An output process is executed by the output unit 509 in operation S1203 to terminate the process.

Figure 17:
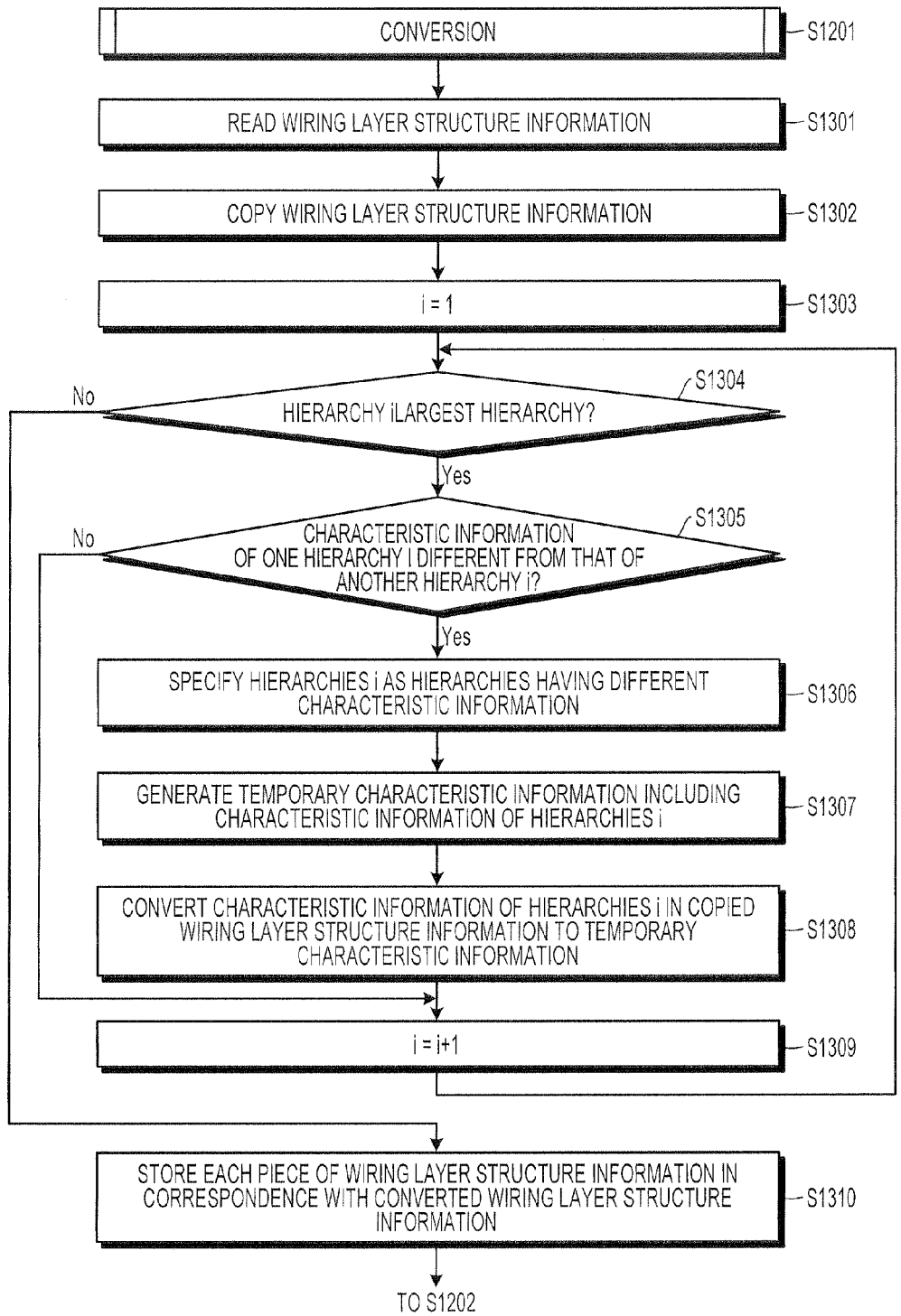
FIG. 17 illustrates an exemplary conversion.

FIG. 17 illustrates an exemplary conversion process. The conversion process illustrated in FIG. 17 may be executed in operation S1201 illustrated in FIG. 16. Wiring layer structure information is read from a storage device in operation S1301. The copying unit 503 copies the wiring layer structure information in operation S1302.

"1" is set for a hierarchy i in operation S1303. Whether the hierarchy i≦ the largest hierarchy in the wiring layer structure information is judged in operation S1304. When the hierarchy i≦ the largest hierarchy in the wiring layer structure information (operation S1304: Yes), whether the characteristic information of one hierarchy i is different from that of another hierarchy i in the wiring layer structure information is judged in operation S1305. When the characteristic information of one hierarchy i is different from that of another hierarchy i in the wiring layer structure information (operation S1305: Yes), the specifying unit 501 specifies the hierarchies i as the hierarchies which has different characteristic information in operation S1306.

The generating unit 502 generates temporary characteristic information including the characteristic information of the hierarchy i in operation S1307. The characteristic information of the hierarchy i in the wiring layer structure information is converted to the temporary characteristic information in operation S1308.

The process "i=i+1" is performed in operation S1309 and the process returns to operation S1304. When the characteristic information of one hierarchy i is not different from that of another hierarchy i in the wiring layer structure information (operation S1305: No), the process proceeds to operation S1309.

When the hierarchy i>the largest hierarchy in the wiring layer structure information (operation S1304: No), the wiring layer structure information and the converted wiring layer structure information, which are associated, are stored in operation S1310 and the process proceeds to operation S1202.

FIG. 18 illustrates an exemplary inverse-conversion process. The inverse-conversion process illustrated in FIG. 18 may be executed in operation S1202 in FIG. 16. The wiring width and the wiring space in the converted wiring layer structure information are supplied to the automatic arranging and wiring tool in operation S1401.

Whether laying-out process is terminated or not is judged in operation S1402. When the laying-out process is not terminated (operation S1402: No), the process in operation S1402 is repeated. When the laying-out process is terminated (operation S1402: Yes), the acquiring unit 506 acquires the layout data from the automatic arranging and wiring tool in operation S1403.

Information on the resistance value and the capacitance value of the converted wiring layer structure information and the layout data are supplied to the R and C extraction tool in operation S1404. The extracted R and C values are supplied to the delay calculation tool and a result of delay calculation by the delay calculation tool is automatically supplied to the timing analysis tool.

Whether timing analysis is terminated or not is judged in operation S1405. When the layout data is not against the constraints on timing, the timing analysis is terminated.

When the timing analysis is not terminated (operation S1405: No), the process in operation S1405 is repeated. When the timing analysis is terminated (operation S1405: Yes), the copying unit 503 copies the layout data for each wiring layer structure information in operation S1406.

Whether there is wiring layer structure information which is not selected from the wiring layer structure information as copy sources (sources from which information is to be copied) is judged in operation S1407. When there exist the non-selected wiring layer structure information (operation S1407: Yes), one wiring layer structure information is selected from the non-selected wiring layer structure information in operation S1408.

Whether there are non-selected hierarchies whose characteristic information is converted to the temporary characteristic information is judged in operation S1409. When there are non-selected hierarchies whose characteristic information is converted to the temporary characteristic information (operation S1409: Yes), one hierarchy is selected from the non-selected hierarchies whose characteristic information is converted to the temporary characteristic information in operation S1410.

The wiring on the selected hierarchy is detected from the layout data in operation S1411. The characteristic information of the selected hierarchy is retrieved from the selected wiring layer structure information in operation S1412. The temporary characteristic information of the detected wiring is converted to the retrieved characteristic information in operation S1413 and the process returns to operation S1409.

When there is no non-selected hierarchy whose characteristic information is converted to the temporary characteristic information (operation S1409: No), the inverse-converted layout data and wiring layer structure information are associated each other in operation S1414 and the process returns to operation S1407.

When there is no non-selected wiring layer structure information (operation S1407: No), the process proceeds to operation S1203 to output the inverse-converted layout data.

The design support program may be recorded in computer readable recording media such as hard disks, flexible disks, CD-ROMs, MOs, DVDs and others. A computer may read the design support program from the recording medium. The design support program may be distributed to other devices via a network such as Internet.

Example embodiments of the present invention have now been described in accordance with the above advantages. It will be appreciated that these examples are merely illustrative of the invention. Many variations and modifications will be apparent to those skilled in the art.

The invention claimed is:

1. A non-transitory computer-readable recording medium that stores therein a design support program, the design support program causing a computer to execute operations of:
specifying a hierarchy from a plurality of hierarchies in one of a plurality of wiring layer structure information, the specified hierarchy including first characteristic information that is different from characteristic information included in other ones of the plurality of hierarchies in other ones of the plurality of wiring layer structure information;
storing, in a storage device, the plurality of wiring layer structure information;
generating second characteristic information from the specified hierarchy including the first characteristic information;
copying the plurality of wiring layer structure information; and
converting the first characteristic information from the specified hierarchy in the copied wiring layer structure information to the second characteristic information.

2. The non-transitory computer-readable recording medium according to claim 1, the design support program further causing the computer to execute:
acquiring circuit information laid out based on the copied wiring layer structure information;
detecting wiring of the first specified hierarchy from the circuit information; and
converting the circuit information of the detected wiring based on the second characteristic information.

3. The non-transitory computer-readable recording medium according to claim 2, the design support program further causing the computer to execute:
acquiring circuit information for each wiring layer structure information in the plurality of wiring layer structure information;
detecting wiring of the specified hierarchy from the circuit information for each wiring layer structure information; and
converting the circuit information for each wiring layer structure information of the detected wiring based on the second characteristic information.

4. The non-transitory computer-readable recording medium according to claim 1,
wherein the first and second characteristic information of the wiring includes a wiring width and a wiring space.

5. The non-transitory computer-readable recording medium according to claim 1,
wherein the first and second characteristic information of the wiring includes information on a resistance value of the wiring and a capacitance value of the wiring, and
wherein the resistance value and the capacitance value are extracted from the converted wiring layer structure information to obtain the circuit information.

6. The non-transitory computer-readable recording medium according to claim 5,
wherein the information on the resistance value and the information on the capacitance value respectively include information on variation values of the resistance value and capacitance value.

7. A design support device that designs a semiconductor circuit, comprising:
a storage unit configured to store a plurality of wiring layer structure information;
a specifying unit configured to specify one of a plurality of hierarchies in one of the plurality of wire layer structure information, the specified hierarchy including first characteristic information that is different from characteristic information included in other ones of the plurality of hierarchies in other ones of the plurality of wire layer structure information;
a generating unit configured to generate second characteristic information of the specified hierarchy including the first characteristic information;
a copying unit configured to copy the plurality of wiring layer structure information; and
a converting unit configured to convert the first characteristic information of the specified hierarchy in the copied wiring layer structure information to the second characteristic information.

8. A design support method, comprising: executing, by a computer, operations including:
specifying one of a plurality of hierarchies in one of a plurality of wiring layer structure information, the specified hierarchy including first characteristic information that is different from characteristic information of other ones of the plurality of hierarchies in other ones of the plurality of wiring layer structure information;
storing, in a storage device, the plurality of wiring layer structure information;
generating second characteristic information of the specified hierarchy including the first characteristic information;
copying the plurality of wiring layer structure information; and
converting the first characteristic information of the specified hierarchy in the copied wiring layer structure information into to the second characteristic information.

* * * * *